United States Patent
Kim et al.

(10) Patent No.: US 10,837,114 B2
(45) Date of Patent: Nov. 17, 2020

(54) COMPOSITION FOR FORMING CONDUCTIVE PATTERN BY IRRADIATION OF ELECTROMAGNETIC WAVES, METHOD FOR FORMING CONDUCTIVE PATTERN USING SAME, AND RESIN STRUCTURE HAVING CONDUCTIVE PATTERN

(71) Applicant: LG CHEM, LTD., Seoul (KR)

(72) Inventors: Jae Hyun Kim, Daejeon (KR); Shin Hee Jun, Daejeon (KR); Jae Jin Kim, Daejeon (KR); Han Nah Jeong, Daejeon (KR); Chee-Sung Park, Daejeon (KR); Bu Gon Shin, Daejeon (KR); Cheol-Hee Park, Daejeon (KR)

(73) Assignee: LG CHEM., LTD., Seoul (KR)

( * ) Notice: Subject to any disclaimer, the term of this patent is extended or adjusted under 35 U.S.C. 154(b) by 396 days.

(21) Appl. No.: 15/510,967

(22) PCT Filed: Oct. 21, 2015

(86) PCT No.: PCT/KR2015/011155
§ 371 (c)(1),
(2) Date: Mar. 13, 2017

(87) PCT Pub. No.: WO2016/064192
PCT Pub. Date: Apr. 28, 2016

(65) Prior Publication Data
US 2017/0275764 A1   Sep. 28, 2017

(30) Foreign Application Priority Data

Oct. 23, 2014   (KR) .................. 10-2014-0144490

(51) Int. Cl.
C23C 18/20    (2006.01)
C08K 3/24     (2006.01)
(Continued)

(52) U.S. Cl.
CPC ............ *C23C 18/20* (2013.01); *C08J 7/065* (2013.01); *C08K 3/013* (2018.01); *C08K 3/22* (2013.01);
(Continued)

(58) Field of Classification Search
CPC . C23C 18/20; C23C 18/1601; C23C 18/1608; C23C 18/1614; C23C 18/204;
(Continued)

(56) References Cited

U.S. PATENT DOCUMENTS 5,955,179 A   9/1999   Kickelhain et al.
6,319,564 B1  11/2001  Naundorf et al.
(Continued)

FOREIGN PATENT DOCUMENTS

EP   2291290 B2    3/2016
JP   2002311843 A  10/2002
(Continued)

*Primary Examiner* — Robert S Walters, Jr.
(74) *Attorney, Agent, or Firm* — Dentons US LLP

(57) ABSTRACT

The present invention relates to a composition for forming a conductive pattern by irradiation of electromagnetic waves capable of allowing excellent formation of a conductive micro-pattern on various polymer resin products comprising a polycarbonate resin or on resin layers by a simple method such as irradiation of electromagnetic waves and plating, and capable of reducing the degradation of the physical properties of the resin products or resin layers caused by the irradiation of electromagnetic waves, a method for forming a conductive pattern using the same, and a resin structure having a conductive pattern. The composition for forming a conductive pattern by irradiation of electromagnetic waves comprises: a polymer resin comprising a polycarbonate resin; and an electromagnetic wave-absorbing inorganic additive which absorbs an electromagnetic wave having a wavelength in the infrared region and satisfies the charac-
(Continued)

teristic that a laser sensitivity Ls defined by a predetermined relational expression is $1.6<-\log(Ls)<6.0$.

14 Claims, 3 Drawing Sheets

(51) Int. Cl.

| | |
|---|---|
| *C23C 18/16* | (2006.01) |
| *C25D 5/56* | (2006.01) |
| *H01B 1/20* | (2006.01) |
| *H01L 23/00* | (2006.01) |
| *H01B 13/00* | (2006.01) |
| *C08K 3/013* | (2018.01) |
| *C08K 3/22* | (2006.01) |
| *C08J 7/06* | (2006.01) |
| *C25D 5/02* | (2006.01) |
| *H01B 1/22* | (2006.01) |
| *H01B 13/34* | (2006.01) |
| *H05K 9/00* | (2006.01) |
| *C23C 18/40* | (2006.01) |

(52) U.S. Cl.
CPC ............ *C08K 3/24* (2013.01); *C23C 18/1601* (2013.01); *C23C 18/1608* (2013.01); *C23C 18/1614* (2013.01); *C23C 18/1641* (2013.01); *C23C 18/204* (2013.01); *C25D 5/024* (2013.01); *C25D 5/56* (2013.01); *H01B 1/20* (2013.01); *H01B 1/22* (2013.01); *H01B 13/00* (2013.01); *H01B 13/348* (2013.01); *H01L 24/00* (2013.01); *H05K 9/0049* (2013.01); *C23C 18/405* (2013.01); *H01L 2224/48227* (2013.01); *H01L 2924/1461* (2013.01)

(58) Field of Classification Search
CPC ... C23C 18/405; C23C 18/1641; C08K 3/013; C08K 3/22; C08K 3/24; C08J 7/065; C25D 5/024; C25D 5/56; H01B 1/20; H01B 1/22; H01B 13/00; H01B 13/348; H01L 24/00; H01L 2224/48227; H01L 2924/1461; H05K 9/0049

See application file for complete search history.

(56) References Cited

U.S. PATENT DOCUMENTS

| | | | |
|---|---|---|---|
| 6,696,173 | B1 | 2/2004 | Naundorf et al. |
| 7,060,421 | B2 | 6/2006 | Naundorf et al. |
| 2003/0094296 | A1 | 5/2003 | Kojima et al. |
| 2003/0152787 | A1 | 8/2003 | Arakawa et al. |
| 2004/0026254 | A1 | 2/2004 | Hupe et al. |
| 2007/0247822 | A1 | 10/2007 | Naundorf |
| 2011/0281135 | A1 | 11/2011 | Gong et al. |
| 2012/0183793 | A1 | 7/2012 | John et al. |
| 2012/0276390 | A1 | 11/2012 | Ji et al. |
| 2012/0279764 | A1 | 11/2012 | Jiang et al. |
| 2013/0106659 | A1 | 5/2013 | Yung et al. |
| 2013/0289178 | A1* | 10/2013 | Li ................ C08L 69/00 524/127 |
| 2014/0159285 | A1 | 6/2014 | Choi |
| 2014/0296410 | A1 | 10/2014 | Cheng et al. |
| 2016/0174370 | A1 | 6/2016 | Park et al. |
| 2016/0203886 | A1 | 7/2016 | Jeong et al. |
| 2016/0295704 | A1 | 10/2016 | Park et al. |

FOREIGN PATENT DOCUMENTS

| | | |
|---|---|---|
| JP | 2003023290 A | 1/2003 |
| JP | 2008034651 A | 2/2008 |
| JP | 2008140972 A | 6/2008 |
| KR | 1020030007966 A | 1/2003 |
| KR | 20040021614 A | 3/2004 |
| KR | 10-0716486 B1 | 5/2007 |
| KR | 1020110112860 A | 10/2011 |
| KR | 1020120121219 A | 11/2012 |
| KR | 1020120124167 A | 11/2012 |
| WO | 2011095632 A1 † | 8/2011 |
| WO | 2013/183788 A1 | 12/2013 |
| WO | 2013183788 A1 † | 12/2013 |

\* cited by examiner
† cited by third party

[FIG. 1]
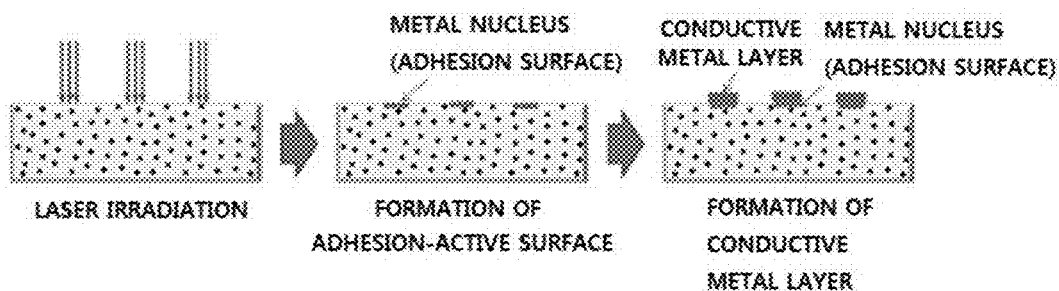
[FIG. 2]
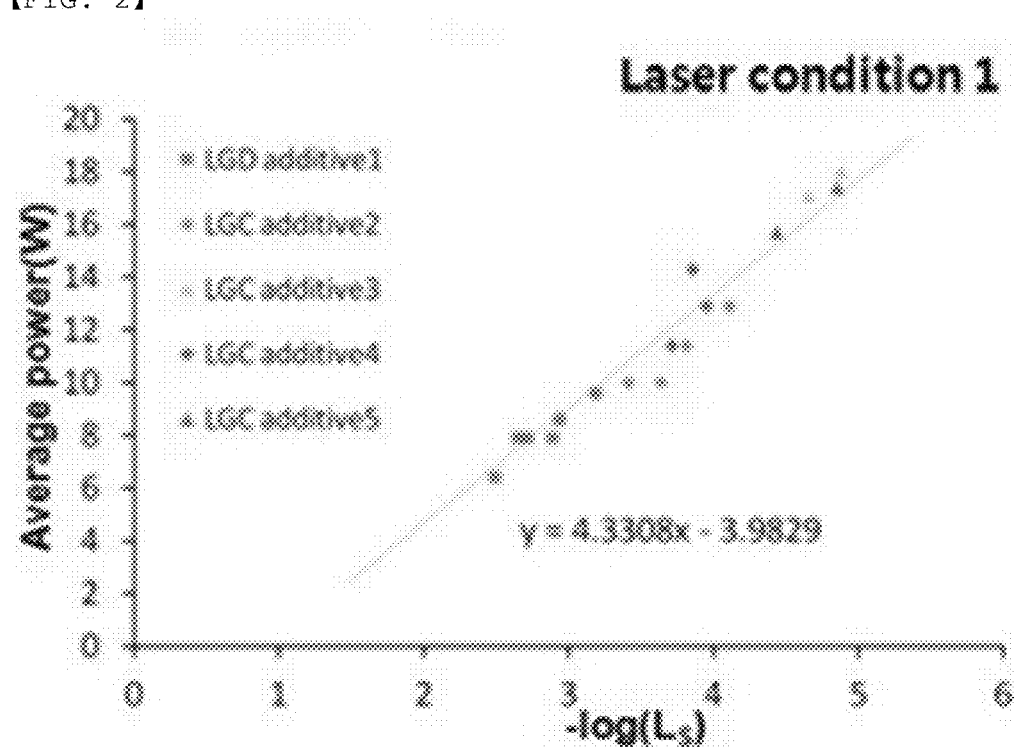

【FIG. 3】
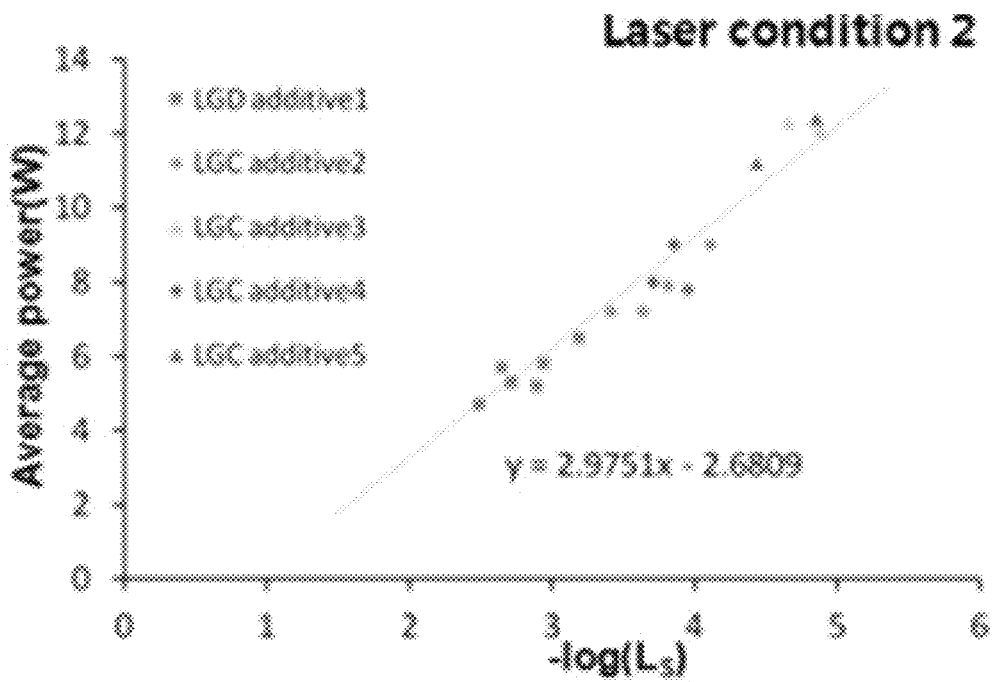
【FIG. 4】
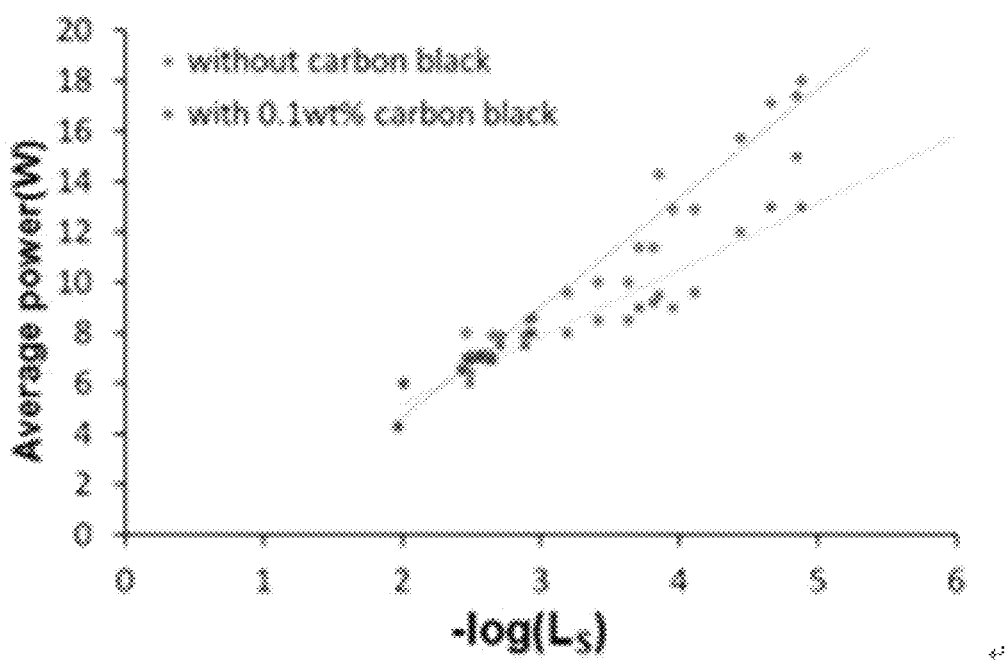

[FIG. 5]
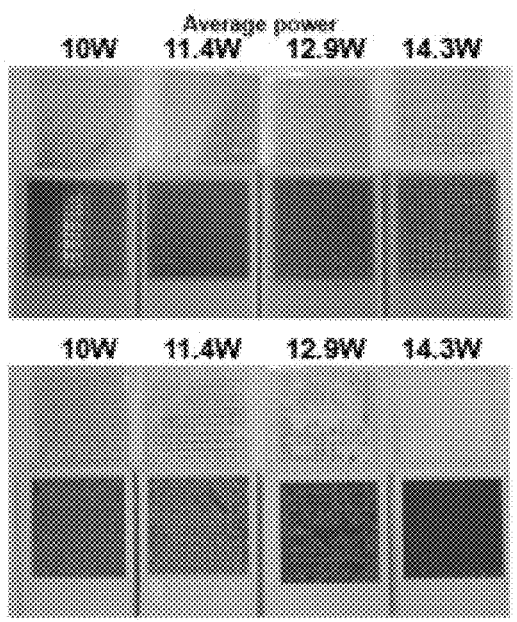

COMPOSITION FOR FORMING CONDUCTIVE PATTERN BY IRRADIATION OF ELECTROMAGNETIC WAVES, METHOD FOR FORMING CONDUCTIVE PATTERN USING SAME, AND RESIN STRUCTURE HAVING CONDUCTIVE PATTERN

CROSS-REFERENCE TO RELATED APPLICATION(S)

This application is a National Stage Application of International Application No. PCT/KR2015/011155, filed Oct. 21, 2015, and claims the benefit of Korean Patent Application No. 10-2014-0144490, filed Oct. 23, 2014, the contents of which are incorporated herein by reference in their entirety for all purposes as if fully set forth below.

TECHNICAL FIELD

The present invention relates to a composition for forming a conductive pattern by irradiation of electromagnetic waves capable of allowing excellent formation of micro-conductive patterns on various polymer resin products or resin layers comprising a polycarbonate resin by a simple method such as electromagnetic wave irradiation and plating, and also capable of reducing the degradation of the physical properties of the resin products or resin layers caused by irradiation of electromagnetic waves, a method for forming a conductive pattern using the same, and a resin structure having a conductive pattern.

BACKGROUND ART

With the development of microelectronic technology in recent years, there is a growing demand for a structure in which micro-conductive patterns are formed on the surface of polymer resin substrates (or products) such as various resin products or resin layers. Such conductive patterns and structures on the surface of the polymer resin substrates can be applied to form various objects such as antennas integrated into cellular phone cases, various sensors, MEMS structures or RFID tags, etc.

Thus, as the interest in the technique of forming conductive patterns on the surface of polymer resin substrates increases, several techniques related thereto have been proposed. However, there is no proposal for a method that can more effectively utilize such techniques yet.

For example, according to a previously known technique, a method for forming a conductive pattern by forming a metal layer on the surface of a polymer resin substrate, followed by applying photolithography, or a method for forming a conductive pattern by printing a conductive paste may be considered. However, when conductive patterns are formed according to these techniques, there are disadvantages in that required steps or equipment become excessively complicated, or that it would be difficult to form excellent micro-conductive patterns. Accordingly, there has been a continuing demand for the development of a technique capable of more effectively forming micro-conductive patterns on the surface of a polymer resin substrate by a simplified process.

In recent years, as one of the methods for solving such a technical demand, there have been proposed methods for forming a conductive pattern by including a special inorganic additive exhibiting absorption characteristics for an electromagnetic wave such as a laser in a polymer resin substrate, and carrying out electromagnetic wave irradiation and plating, and some of these methods for forming conductive patterns have been applied.

According to these methods, for example, conductive patterns are formed on the polymer resin substrate by blending and molding special inorganic additives (for example, Sb doped $SnO_2$, etc.) including a transition metal such as antimony or tin, etc. in a polymer resin chip to form the polymer resin substrate and directly irradiating an electromagnetic wave such as a laser to a predetermined region, followed by forming a metal layer by plating in the region irradiated with the laser.

However, in such methods for forming conductive patterns, a considerable amount of the special inorganic additives needs to be blended in the polymer resin chip itself, and thus, these inorganic additives may degrade the physical properties such as mechanical properties and dielectric constant of the polymer resin substrate or resin product formed therefrom, and may cause dielectric loss. If any means of reducing the content of these inorganic additives or micronizing the particle size thereof is applied in order to reduce the loss of physical properties caused by the addition of the inorganic additives, the absorbency and sensitivity therefor are not sufficiently expressed in the irradiation region of the electromagnetic waves such as a laser, thus, it may be difficult to form excellent conductive patterns even if the plating is performed after the irradiation of electromagnetic waves, and the conductive patterns may not have sufficient adhesion to the polymer resin substrate, and therefore, they often fall off easily.

Further, in order to solve the above-mentioned problems, it may be possible to consider irradiation conditions of electromagnetic waves such as a laser, for example, a method of further increasing an average power for irradiating electromagnetic waves, etc., but even in this case, the polymer resin substrate itself may be excessively damaged due to the high-power irradiation of electromagnetic waves, leading to the degradation of mechanical properties thereof. In many cases, it may be difficult to form excellent conductive patterns even by irradiation of electromagnetic waves under such severe conditions. Furthermore, as it is necessary to irradiate electromagnetic waves under severe conditions which are commercially inappropriate, the economical efficiency of the overall process may also be significantly reduced.

Due to such problems of the prior art, there has been a continuing demand for the development of the related technique capable of allowing excellent formation of micro-conductive patterns on various polymer resin products or resin layers by a simple method such as electromagnetic wave irradiation and plating, and capable of reducing the degradation of the physical properties of the resin products or resin layers caused by the irradiation of electromagnetic waves.

DETAILED DESCRIPTION OF THE INVENTION

Technical Problem

On objective of the present invention is to provide a composition for forming a conductive pattern capable of allowing excellent formation of micro-conductive patterns on various polymer resin products or resin layers by a simple method such as electromagnetic wave irradiation and plating, and capable of reducing degradation of the physical properties of the resin products or resin layers caused by the irradiation of electromagnetic waves.

Another objective of the present invention is to provide a resin structure having a conductive pattern formed from the composition for forming a conductive pattern above, etc.

Technical Solution

The present invention provides a composition for forming a conductive pattern by irradiation of electromagnetic waves comprising: a polymer resin including a polycarbonate resin; and an electromagnetic wave-absorbing inorganic additive which absorbs an electromagnetic wave in the infrared region and satisfies the characteristic that a laser sensitivity Ls defined by Equation 1 below is 1.6<−log(Ls)<6.0:

$$\text{Laser sensitivity } Ls = Re^{-1.4} \times wt \times Iaa \qquad [\text{Equation 1}]$$

In Equation 1 above,

Re represents an effective radius of the electromagnetic wave-absorbing inorganic additive obtained by the equation of Re=300/[A (m$^2$/g)×B (g/cm$^3$)], from the BET specific surface area A (m$^2$/g) and density B (g/cm$^3$) of the electromagnetic wave-absorbing inorganic additive, wt is a value representing the content (weight) of the electromagnetic wave-absorbing inorganic additive in terms of a weight fraction relative to the total composition when the total content (weight) of the composition for forming a conductive pattern is 1, and Iaa represents an effective light absorption rate of the electromagnetic wave-absorbing inorganic additive obtained by the equation of Iaa=(1−I$_R$)$^2$/2I$_R$ (%), from the absorbance I$_R$ (%) for electromagnetic waves having a wavelength in a predetermined infrared region measured using a UV-vis-IR spectrum, relative to the electromagnetic wave-absorbing inorganic additive.

In the composition for forming a conductive pattern by irradiation of electromagnetic waves, the polymer resin may further include at least one resin selected from the group consisting of ABS resin, polyalkylene terephthalate resin, polypropylene resin and polyphthalamide resin, in addition to polycarbonate resin.

Further, in the composition for forming a conductive pattern by irradiation of electromagnetic waves, the electromagnetic wave-absorbing inorganic additive may contain at least one conductive metal element, and may include a non-conductive metal compound which contains cations and anions and in which the cations and anions are chemically bonded to each other. More specific examples of the electromagnetic wave-absorbing inorganic additive in the form of the non-conductive metal compound include at least one non-conductive metal compound selected from the group consisting of CuCrO$_2$, NiCrO$_2$, AgCrO$_2$, CuMoO$_2$, NiMoO$_2$, AgMoO$_2$, NiMnO$_2$, AgMnO$_2$, NiFeO$_2$, AgFeO$_2$, CuWO$_2$, AgWO$_2$, NiWO$_2$, AgSnO$_2$, NiSnO$_2$, CuSnO$_2$, CuAlO$_2$, CuGaO$_2$, CuInO$_2$, CuTlO$_2$, CuYO$_2$, CuScO$_2$, CuLaO$_2$, CuLuO$_2$, NiAlO$_2$, NiGaO$_2$, NiYO$_2$, NiScO$_2$, NiLaO$_2$, NiLuO$_2$, AgAlO$_2$, AgGaO$_2$, AgInO$_2$, AgTlO$_2$, AgYO$_2$, AgScO$_2$, AgLaO$_2$, AgLuO$_2$, CuSn$_2$(PO$_4$)$_3$, CuI, CuCl, CuBr, CuF, AgI, CuSO$_4$, Cu$_2$P$_2$O$_7$, Cu$_3$P$_2$O$_8$, Cu$_4$P$_2$O$_9$, Cu$_5$P$_2$O$_{10}$ and Cu$_2$P$_4$O$_{12}$.

Furthermore, according to one embodiment of the composition for forming a conductive pattern by irradiation of electromagnetic waves, the electromagnetic wave-absorbing inorganic additive may satisfy the characteristic that the laser sensitivity Ls is 1.6<−log(Ls)<5.6, and at the same time, may exhibit a characteristic for generating a metal nucleus containing the conductive metal elements or ions thereof by absorbing the electromagnetic waves having a wavelength in the infrared region. In this case, the electromagnetic wave-absorbing inorganic additive may be used as a single material which satisfies both of these two characteristics, and specific examples of the inorganic additive include non-conductive metal compounds listed above.

However, according to another embodiment of the composition for forming a conductive pattern, the electromagnetic wave-absorbing inorganic additive may only satisfy the characteristic that the laser sensitivity Ls is about 1.6<−log(Ls)<5.6. In this case, a conductive seed-forming agent for generating a metal nucleus containing conductive metal elements or ions thereof by irradiation of electromagnetic waves having a wavelength in the infrared region may further be used, as needed.

In another embodiment, the conductive seed-forming agent may be applied and formed on the surface of the polymer resin, and the electromagnetic wave-absorbing inorganic additive may include at least one selected from the group consisting of Fe$_3$(PO$_4$)$_2$, Zn$_3$(PO$_4$)$_2$, ZnFe$_2$(PO$_4$)$_2$, NbOx and MoOx. Further, in another embodiment, the conductive seed-forming agent may include at least one conductive metal selected from the group consisting of copper (Cu), platinum (Pt), palladium (Pd), silver (Ag), gold (Au), nickel (Ni), tungsten (W), titanium (Ti), chromium (Cr), aluminum (Al), zinc (Zn), tin (Sn), lead (Pb), magnesium (Mg), manganese (Mn) and ion (Fe), its ion or complex ion.

On the other hand, according to still another embodiment of the composition for forming a conductive pattern, it may further include at least one electromagnetic wave-absorbing auxiliary selected from the group consisting of carbon black, burnt pine, oily smoke, lamp black, channel black, furnace black, acetylene black and titanium dioxide (TiO$_2$). These electromagnetic wave-absorbing auxiliaries may assist in the absorbency for the electromagnetic waves exhibited by the electromagnetic wave-absorbing inorganic additive. Thus, even when an electromagnetic wave-absorbing inorganic additive exhibiting a relatively low laser sensitivity, for example, a characteristic of about 5.6≤−log(Ls)<6.0 is used, it may allow higher expression of absorbency and sensitivity in the irradiation region of the electromagnetic waves. Accordingly, the range of the electromagnetic wave-absorbing inorganic additive applicable for forming excellent conductive patterns in the region irradiated with electromagnetic wave may be further expanded.

On the other hand, in the composition for forming a conductive pattern described above, the electromagnetic wave-absorbing inorganic additive may be contained in an amount of about 0.05 to 30% by weight or about 0.1 to 20% by weight based on the total composition.

Further, the composition for forming a conductive pattern may be a composition that is applied to form a conductive pattern by irradiating a laser electromagnetic wave having a wavelength of about 1000 nm to 1200 nm, typically about 1064 nm, with an average power of about 1 to 20 W or about 1.5 to 20 W, and carrying out the plating in the region irradiated with the laser electromagnetic wave.

Furthermore, in the composition for forming a conductive pattern, the electromagnetic wave-absorbing inorganic additive may be contained in the form of having an average particle diameter of about 0.05 to 20 μm or about 0.1 to 15 μm.

Moreover, in the case in which additional electromagnetic wave-absorbing auxiliary is used together with the electromagnetic wave-absorbing inorganic additive, as needed, the electromagnetic wave-absorbing auxiliary may be contained in an amount of about 0.01 to 20% by weight based on the total composition. Herein, a carbon-based black pigment such as carbon black, etc. may be contained in an amount of about 0.01 to 5% by weight or about 0.1 to 2% by weight, and titanium dioxide may be contained in an amount of about 0.1 to 20% by weight or about 0.5 to 10% by weight.

In addition, the composition for forming a conductive pattern described above may further include at least one additive selected from the group consisting of UV stabilizer, flame retardant, lubricant, antioxidant, inorganic filler, color additive, impact modifier, flow modifier and functional modifier in an amount of about 0.01 to 30% by weight based on the total composition.

On the other hand, the present invention provides a method for forming a conductive pattern by direct irradiation of electromagnetic waves comprising: forming a resin layer by molding a composition for forming a conductive pattern described above into a resin product or by applying the composition onto another product; irradiating an electromagnetic wave having a wavelength in the infrared region onto a predetermined region of the resin product or resin layer; and forming a conductive metal layer by plating the region irradiated with the electromagnetic waves.

Further, the present invention provides a resin structure having a conductive pattern comprising: a polymer resin substrate including a polycarbonate resin; an electromagnetic wave-absorbing inorganic additive which is dispersed in the polymer resin substrate, and which absorbs an electromagnetic wave having a wavelength in the infrared region and satisfies the characteristic that a laser sensitivity Ls defined by Equation 1 above is $1.6 < -\log(Ls) < 6.0$; and a conductive metal layer formed on a predetermined region of the polymer resin substrate.

In the resin structure, the predetermined region on which the conductive metal layer is formed may correspond to the region irradiated with the electromagnetic waves having a wavelength in the infrared region in the polymer resin substrate.

Advantageous Effect

According to the present invention, even if the special inorganic additive exhibiting the electromagnetic wave absorbency is used in a relatively low content and the electromagnetic waves in the infrared region are irradiated under a mild irradiation condition (for example, low average power), which is commercially and commonly applied, there are provided the composition for forming a conductive pattern by irradiation of electromagnetic waves capable of allowing excellent formation of micro-conductive patterns exhibiting excellent adhesion to the polycarbonate-based resin substrate in the irradiation region of the electromagnetic waves, and the method for forming a conductive pattern using the same, etc.

By applying this, it is possible to form excellent conductive patterns on the polycarbonate-based resin substrate even when the specific inorganic additive is used in a relatively low content and the electromagnetic waves are irradiated under a mild condition such as low power, etc. As a result, it is possible to minimize the degradation of the excellent physical properties of the polycarbonate-based resin substrate caused by irradiation of electromagnetic waves or the use of special inorganic additive, etc., and the economical efficiency of the overall process and products may be significantly improved.

Accordingly, it is possible to very effectively form conductive patterns for antennas, RFID tags, various sensors, MEMS structures, and the like on various resin products such as cellular phone cases by using the composition for forming a conductive pattern or the method for forming a conductive pattern, etc.

BRIEF DESCRIPTION OF DRAWINGS

FIG. 1 is a schematic diagram which schematically shows an example of the method for forming a conductive pattern by direct irradiation of electromagnetic waves in the order of process according to another embodiment of the invention.

FIG. 2 is a graph showing the relationship between the −log (Ls) value (X-axis) of each composition and the minimum power condition (Y axis) of the laser electromagnetic wave required for forming an excellent conductive pattern, when the conductive patterns were formed on the polycarbonate resin substrate by using the composition for forming a conductive pattern of Examples 1 to 17.

FIG. 3 is a graph showing the relationship between the −log (Ls) value (X-axis) of each composition and the minimum power condition (Y axis) of the laser electromagnetic wave required for forming an excellent conductive pattern, when the conductive patterns were formed on the polycarbonate resin substrate by using the composition for forming a conductive pattern of Examples 18 to 34 (the laser irradiation conditions were different from those of Examples 1 to 17).

FIG. 4 is a graph showing the relationship between the −log (Ls) value (X-axis) of each composition and the minimum power condition (Y axis) of the laser electromagnetic wave required for forming an excellent conductive pattern, when the conductive patterns were formed on the polycarbonate resin substrate by using the composition for forming a conductive pattern of Examples 35 to 51 (carbon black was further used in Examples 1 to 17).

FIG. 5 shows images of evaluating whether excellent conductive patterns were formed and carrying out a test for determining the minimum power condition for the electromagnetic wave required therefor, when the conductive patterns were formed on the polycarbonate resin substrate by using each of the composition for forming a conductive pattern of Example 17 and of Example 52 in which titanium oxide was further used.

DETAILED DESCRIPTION OF THE EMBODIMENTS

Hereinafter, the composition for forming a conductive pattern, the method for forming a conductive pattern using the same and the resin structure having a conductive pattern according to specific embodiments of the present invention will be described.

According to one embodiment of the present invention, there is provided a composition for forming a conductive pattern by irradiation of electromagnetic waves comprising: a polymer resin including a polycarbonate resin; and an electromagnetic wave-absorbing inorganic additive which absorbs an electromagnetic wave in the infrared region and satisfies the characteristic that a laser sensitivity Ls defined by Equation 1 below is $1.6 < -\log(Ls) < 6.0$:

$$\text{Laser sensitivity } Ls = Re^{-1.4} \times wt \times Iaa \quad \text{[Equation 1]}$$

In Equation 1 above,

Re represents an effective radius of the electromagnetic wave-absorbing inorganic additive obtained by the equation of $Re = 300/[A\ (m^2/g) \times B\ (g/cm^3)]$, from the BET specific surface area $A\ (m^2/g)$ and density $B\ (g/cm^3)$ of the electromagnetic wave-absorbing inorganic additive, wt is a value representing the content (weight) of the electromagnetic wave-absorbing inorganic additive in terms of a weight fraction relative to the total composition when the total content (weight) of the composition for forming a conductive pattern is 1, and Iaa represents an effective light absorption rate of the electromagnetic wave-absorbing inorganic additive obtained by the equation of Iaa=$(1-I_R)^2/2I_R$ (%), from the absorbance $I_R$ (%) for electromagnetic waves having a wavelength in a predetermined infrared region measured using a UV-vis-IR spectrum, relative to the electromagnetic wave-absorbing inorganic additive.

First, a method for forming a conductive pattern on a resin substrate such as a polymer resin product including a polycarbonate resin or a resin layer using the composition for forming a conductive pattern according to an embodiment of the present invention is as follows. When the composition for forming a conductive pattern is molded into a resin product or a resin layer by extrusion and/or injection, and then electromagnetic waves such as a laser having a wavelength in the infrared region is irradiated to the region where the conductive pattern is to be formed, the electromagnetic wave-absorbing inorganic additive uniformly dispersed on the corresponding region of the polymer resin substrate absorbs the electromagnetic waves at a certain level or higher. Due to the absorbency and/or sensitivity of the electromagnetic waves exhibited by the electromagnetic wave-absorbing inorganic additive, the surface of the polymer resin substrate in the irradiation region of the electromagnetic waves may have a roughness at a certain level or higher. At the same time, the electromagnetic wave-absorbing inorganic additive absorbs the electromagnetic waves having a wavelength in the infrared region, and thereby, for example, generating a metal nucleus containing the conductive metal elements contained in the inorganic additive or ions thereof in the irradiation region of the electromagnetic waves.

Thereafter, when the surface of the polymer resin substrate is plated by electroless plating, etc., in the irradiation region of the electromagnetic waves, that is, in the region where the metal nuclei generated with a surface roughness at a certain level or higher, the plating may be performed uniformly and favorably as the metal nuclei act as a seed during plating, and the conductive metal layer formed by such plating may be adhered to the surface of the polymer substrate with a relatively high adhesive force, thereby forming conductive patterns. On the contrary, in the remaining part, the plating itself may not be proceeded properly as the metal nuclei are not formed (that is, the conductive metal layer itself may not be properly formed), and even if plating is partially carried out, the conductive metal layer cannot exhibit adhesion to the surface of the polymer resin substrate. Therefore, in the non-irradiated region of the electromagnetic waves, the conductive metal layer itself cannot be formed, or even if the plating is partially carried out, the conductive metal layer formed by such plating may be easily removed. Accordingly, the conductive metal layer may selectively remain only in the irradiation region of the electromagnetic waves, and thus, micro-conductive patterns in the desired form may be formed on the polymer resin substrate.

Herein, when the electromagnetic wave of an appropriate level (average power, etc.) in accordance with the electromagnetic wave absorbency and/or sensitivity of the inorganic additive is irradiated, a favorable and uniform plating may be carried out as the metal nuclei are sufficiently formed, which in turn, serve as a seed, and the conductive metal layer formed by the plating exhibits excellent adhesion by the surface roughness of a certain level or higher, thereby forming excellent conductive patterns. On the contrary, when an electromagnetic wave of an insufficient level (average power, etc.) is irradiated in consideration of the electromagnetic wave absorbency and/or sensitivity of the inorganic additive, the metal nuclei serving as a seed during plating may not be sufficiently formed, and thus it may be difficult to carry out a uniform plating, and further, it may be difficult to form excellent conductive patterns in the irradiation region of the electromagnetic waves as the surface roughness and the adhesive force of the conductive metal layer resulting therefrom are deteriorated.

Therefore, in order to form excellent conductive patterns in the desired form on the polymer resin substrate by the above-described method more preferably than those formed by uniform plating (to have a higher adhesion to the surface of the polymer resin substrate), in the irradiation region of the electromagnetic waves, it was confirmed that it is very important to sufficiently generate metal nuclei serving as the seed and allow the surface of the polymer resin substrate to have a surface roughness of a certain level or higher by allowing the electromagnetic wave-absorbing inorganic additive to exhibit higher electromagnetic wave absorbency and/or sensitivity.

However, in order to exhibit such high electromagnetic wave absorbency and/or sensitivity, when the irradiation conditions are made harsh such as simply increasing the content of the inorganic additive or increasing the electromagnetic wave irradiation power, it may significantly degrade the physical properties such as the mechanical properties of the polymer resin substrate, particularly, of the polycarbonate-based resin substrate generally known to have excellent physical properties. Accordingly, even when the laser electromagnetic wave having a wavelength in the infrared region of about 1000 nm to 1200 nm is irradiated under the irradiation condition of the electromagnetic waves, for example, under the mild condition with an average power of about 1 to 20 W, for example, about 1.5 to 15 W or about 1.5 to 20 W, which is commercially and commonly applied, without significantly increasing the content of the inorganic additives, there has been a continuous request to develop the composition and related technique capable of allowing a uniform plating on the surface of the polymer resin substrate in the irradiation region of the electromagnetic waves and capable of forming excellent conductive patterns exhibiting excellent adhesive force.

The present inventors have continuously studied to solve such a technical request, and as a result, it was found that, by controlling the type, content, shape and size of the electromagnetic wave-absorbing inorganic additives, the physical property value of the laser sensitivity Ls defined by Equation 1 above represented by these inorganic additives may be adjusted. Further, the present inventors have experimentally confirmed that the technical request described above related to the polycarbonate resin substrate may be resolved by controlling the type, content, shape and size of the electromagnetic wave-absorbing inorganic additives such that the laser sensitivity Ls may satisfy the characteristics of approximately 1.6<–log (Ls)<6.0, more preferably approximately 1.6<–log (Ls)<5.6 or 2.0<–log(Ls)<5.0, thereby completing the present invention.

That is, as also supported by the embodiments which will be described later, when the electromagnetic wave-absorbing inorganic additives satisfying the characteristic of approximately 1.6<–log(Ls)<6.0 are applied, it was confirmed that it is possible to form a surface roughness of a certain level or higher on the resin substrate in the irradiation region of the electromagnetic waves under the mild irradiation condition of the electromagnetic waves which is commercially and commonly applied, without significantly increasing the content of these the electromagnetic wave-absorbing inorganic additives, and that metal nuclei serving as the seed may be sufficiently generated during plating. As a result, it was confirmed excellent conductive patterns exhibiting excellent adhesion to the surface of the resin substrate may be easily formed, while minimizing the degradation of the physical properties of the polycarbonate-based resin substrate caused by the addition of the inorganic additives or the irradiation of electromagnetic waves.

On the contrary, when the $-\log$ (Ls) is excessively increased to about 6.0 or higher, it is necessary to irradiate electromagnetic waves under a very strong power condition exceeding about 20 W in order to form the surface roughness that can achieve the excellent adhesion and to sufficiently form the metal nuclei, as the resin substrate including the inorganic additives exhibits a low sensitivity to the electromagnetic waves such as a laser, etc. Accordingly, the physical properties of the polycarbonate-based resin substrate may significantly decrease. Moreover, since the irradiation of electromagnetic waves under these harsh conditions exceeds the scope which is commercially and commonly applied, the cost of overall process may also increase significantly.

In contrast, considering the absorptive inorganic additives for electromagnetic waves in the infrared region which have become known up until now, it is substantially difficult to satisfy the characteristic that $-\log$ (Ls) is about 1.6 or less, or the content of the inorganic additives may excessively increase in order to satisfy the condition. In this case, the physical properties of the polycarbonate-based resin substrate may be significantly degraded, which is not appropriate. Moreover, because the minimum power (threshold laser power) of electromagnetic waves such as a laser required for causing the denaturation of the resin substrate is about 1.0 W, and even if the type and content of the inorganic additives which have $-\log$ (Ls) of about 1.6 of less are used, it may difficult to adjust the irradiation conditions of the electromagnetic waves to an average power of less than about 1.0 W. As a result, the use of inorganic additives having the $-\log$ (Ls) of about 1.6 or less may merely result in the degradation of the physical properties of the resin substrate according to the non-economical efficiency of the overall process or an increase in the content of the inorganic additives, and also, it may be difficult to expect any additional effects.

Meanwhile, hereinafter, the technical meanings, measurements and calculation methods of the laser sensitivity Ls, and specific embodiments for accomplishing the same will be described.

First, in Equation 1 which defines the laser sensitivity Ls, Re represents an effective radius of the electromagnetic wave-absorbing inorganic additive obtained by the equation of Re=300/[A (m²/g)×B (g/cm³)], from the BET specific surface area A (m²/g) and density B (g/cm³) of the electromagnetic wave-absorbing inorganic additive. The present inventors have confirmed that the electromagnetic wave-absorbing inorganic additives in the polymer resin substrate, when the electromagnetic waves were irradiated, exhibit scattering characteristics due to the surface shape and size of the particles, etc., together with the absorbency to the electromagnetic waves. In order to consider both absorbency and scattering characteristics, the measured value of the BET specific surface area A (m²/g) was assumed as $4\pi Re^2$ (m²)/weight (g) and the measured value of the density B (g/cm³) as ¾ [(weight (g))/($\pi Re^3$ (cm³)) to calculate the effective radius therefrom. Further, the effective radius Re of the electromagnetic wave-absorbing inorganic additive which is calculated by the equation of Re=300/[A (m²/g)×B (g/cm³) was obtained by considering a constant for an appropriate unit conversion of the effective radius. Herein, the BET specific surface area A (m²/g) may be measured by a conventional method of measuring the specific surface area of an inorganic particle, and the density B (g/cm³) may be determined according to the type of materials constituting the electromagnetic wave-absorbing inorganic additives.

After obtaining the effective radius by these methods, the relevant experiments were continuously carried out, and as a result, it was confirmed that the electromagnetic wave sensitivity, which was taken into consideration along with the electromagnetic wave absorbency and scattering characteristics of the electromagnetic wave-absorbing inorganic additives, was proportional to $Re^{-1.4}$.

In addition, the wt in Equation 1 is a factor for considering the content of the electromagnetic wave-absorbing inorganic additives, and when the total content (weight) of the composition for forming a conductive pattern is 1, the content of the electromagnetic wave-absorbing inorganic additives may be expressed as a weight fraction of the total composition (for example, when the inorganic additive in the total composition is 3% by weight, the wt is 0.03, which is the weight fraction relative to the total composition 1).

Further, the Iaa is a constant for the electromagnetic wave absorbency that is represented by a specific inorganic additive depending on the types of the electromagnetic wave-absorbing inorganic additives, and may represent an effective light absorption rate of the electromagnetic wave-absorbing inorganic additives obtained by the equation of Iaa=$(1-I_R)^2/2\ I_R$, from the absorbance IR (%) for an electromagnetic wave having a wavelength of a predetermined infrared region measured using a UV-vis-IR spectrum (for example, a wavelength of about 1000 nm to 1200 nm, typically about 1064 nm), relative to the organic additives.

The present inventors have obtained the physical property values of Ls from the $Re^{-1.4}$, wt and Iaa measured and calculated as described above. As already described above, when the electromagnetic wave-absorbing inorganic additives, in which the particle shape, size, content and types thereof, etc. are controlled are applied to the polycarbonate-based resin substrate such that the physical property value of Ls may satisfy the relationship of about 1.6<$-\log$ (Ls)<6.0, it was confirmed that, even when a relatively low content of inorganic additives was used and the electromagnetic waves were irradiated under a mild condition, excellent conductive patterns could be easily formed as an excellent electromagnetic wave sensitivity was exhibited in the irradiation region of the electromagnetic waves.

Next, as for the laser sensitivity Ls described above, specific examples of the composition according to one embodiment for satisfying the relationship of about 1.6<$-\log$(Ls)<6.0 will be described.

First, the relationship of about 1.6<$-\log$(Ls)<6.0 described above was determined in consideration of the physical properties of the polycarbonate-based resin substrate among various polymer resin substrates, and in the composition for forming a conductive pattern according to the one embodiment, the polymer resin includes a polycarbonate resin. However, considering the types of the polymer resin substrates such as resin products or resin layers to be obtained by using the composition of the one embodiment, it may further include additional polymer resins such as various thermoplastic resins or thermosetting resins other than the polycarbonate resin. Specific examples of these additional polymer resins include ABS resin, polyalkylene terephthalate resin, polypropylene resin or polyphthalamide resin, etc., and various resins which can be used together with two or more resins selected from these resins or other polycarbonate resins may further be included.

In addition, the electromagnetic wave-absorbing inorganic additive contains at least one conductive metal element such as Cu, Ag or Ni, etc., and may include a non-conductive metal compound which contains cations and anions and in which the cations and anions chemically form ionic bonds and selectively form covalent bonds to each other. When the non-conductive metal compound having such a form is irradiated with an electromagnetic wave such as a laser, a metal nucleus containing the conductive metal elements or (complex) ions thereof may be sufficiently reduced/precipitated and formed from the non-conductive metal compound. Such metal nuclei may be selectively exposed in a predetermined region irradiated with electromagnetic waves to form an adhesive-active surface on the surface of the polymer resin substrate. When the electromagnetic wave sensitivity is enhanced by satisfying the relationship of about $1.6<-\log(Ls)<6.0$ described above, the metal nuclei and adhesive-active surface may be more favorably formed. Further, due to the metal nuclei and adhesive-active surface, a uniform plating may be favorably carried out by using them as a seed, and excellent conductive patterns having far more excellent adhesion to the surface of the polymer resin substrate in the irradiation region of the electromagnetic waves may be formed.

More specific examples of the electromagnetic wave-absorbing inorganic additives in the form of the non-conductive metal compound described above include at least one non-conductive metal compound selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, $CuAlO_2$, $CuGaO_2$, $CuInO_2$, $CuTlO_2$, $CuYO_2$, $CuScO_2$, $CuLaO_2$, $CuLuO_2$, $NiAlO_2$, $NiGaO_2$, $NiYO_2$, $NiScO_2$, $NiLaO_2$, $NiLuO_2$, $AgAlO_2$, $AgGaO_2$, $AgInO_2$, $AgTlO_2$, $AgYO_2$, $AgScO_2$, $AgLaO_2$, $AgLuO_2$, $CuSn_2(PO_4)_3$, $CuI$, $CuCl$, $CuBr$, $CuF$, $AgI$, $CuSO_4$, $Cu_2P_2O_7$, $Cu_3P_2O_8$, $Cu_4P_2O_9$, $Cu_5P_2O_{10}$ and $Cu_2P_4O_{12}$.

As the non-conductive metal compounds exemplified above exhibit far more excellent absorbency for the electromagnetic waves having a wavelength in the infrared region, for example a wavelength of about 1000 nm to 1200 nm, typically about 1064 nm, it is possible to achieve the characteristic of about $1.6<-\log(Ls)<6.0$. Furthermore, the non-conductive metal compounds may easily facilitate the reduction/precipitation of the conductive metals (for example, Cu, etc.) or ions thereof contained therein, and the formation of the metal nuclei and adhesion-active surface accordingly. Therefore, as these non-conductive metal compounds are used as electromagnetic wave-absorbing inorganic additives, excellent conductive patterns having excellent adhesion to the polymer resin substrate in the region irradiated with electromagnetics may be easily formed.

According to an embodiment of the composition for forming a conductive pattern by irradiation of electromagnetic waves of the one embodiment described above, the electromagnetic wave-absorbing inorganic additives may satisfy the characteristic that the laser sensitivity Ls is about $1.6<-\log(Ls)<5.6$, and at the same time, it may exhibit a characteristic for sufficiently forming the metal nuclei and adhesive-active surface described above. In this case, the electromagnetic wave-absorbing inorganic additive may be used as a single material that satisfies both of these characteristics together, and examples of the single material include the non-conductive metal compounds shown as the examples above, and more appropriately, it may include non-conductive metal compounds containing Cu.

However, according to another embodiment of the composition for forming a conductive pattern, the electromagnetic wave-absorbing inorganic additives may only satisfy the characteristic that the laser sensitivity Ls is about $1.6<-\log(Ls)<5.6$. In this case, a conductive seed-forming agent which generates a metal nucleus containing conductive metal elements or ions thereof by irradiation of electromagnetic waves having a wavelength in the infrared region may further be included, as need, in the composition according to the one embodiment. In the other embodiments, examples of the electromagnetic wave-absorbing inorganic additives may include at least one selected from the group consisting of $Fe_3(PO_4)_2$, $Zn_3(PO_4)_2$, $ZnFe_2(PO_4)_2$, $NbOx$ and $MoOx$.

Even in the case of using these electromagnetic wave-absorbing inorganic additives, or the non-conductive metal compounds shown as examples above, for example, the non-conductive metal compounds including Ag or Ni, etc., the metal nuclei may not be sufficiently generated depending on the amount used thereof or the irradiation conditions of the electromagnetic waves. In this case, the conductive seed-forming agent may further be used to form far more excellent conductive patterns by sufficiently forming the metal nuclei, and adhesive-active surface including the same. Herein, the conductive seed-forming agent may be contained in the polymer resin together with the electromagnetic wave-absorbing inorganic additives, but may be applied and formed in the form of a solution or dispersion on the surface of the polymer resin substrate. Accordingly, a conductive seed is formed on the polymer resin substrate in the region irradiated with the electromagnetic waves, and the conductive seed may grow during plating. As a result, it may play a role in enabling a favorable formation of excellent conductive metal layers by promoting excellent and uniform plating.

The conductive seed-forming agent may include at least one conductive metal selected from the group consisting of copper (Cu), platinum (Pt), palladium (Pd), silver (Ag), gold (Au), nickel (Ni), tungsten (W), titanium (Ti), chromium (Cr), aluminum (Al), zinc (Zn), tin (Sn), lead (Pb), magnesium (Mg), manganese (Mn) and iron (Fe), its ion or complex ion. More particularly, the conductive seed-forming agent may merely be the conductive metal, ion thereof or complex ion itself, but may also be any form of metal nanoparticles, metal compounds or metal complex compounds containing the same. Further, the conductive seed-forming agent may be provided and used in the form of a solution or dispersion containing the conductive metals, ions thereof or complex ions, or metal nanoparticles, metal compounds or metal complex compounds containing the same.

On the other hand, according to still another embodiment of the composition for forming a conductive pattern of the one embodiment above, it may further include an electromagnetic wave-absorbing auxiliary including at least one carbon-based black pigment selected from the group consisting of carbon black, burnt pine, oily smoke, lamp black, channel black, furnace black, acetylene black; or titanium dioxide ($TiO_2$), which is one type of white pigment, in addition to the respective components described above. The electromagnetic wave-absorbing auxiliary may further enhance the absorbency and/or sensitivity for the electromagnetic waves exhibited by the electromagnetic wave-absorbing inorganic additives by assisting them.

Therefore, when these electromagnetic wave-absorbing auxiliaries are further used, and even when the electromagnetic wave-absorbing inorganic additives exhibiting a relatively low laser sensitivity, for example, a characteristic of about $5.6 \leq -\log(Ls) < 6.0$, is used among the range of about $1.6 < -\log(Ls) < 6.0$, the absorbency and sensitivity higher than those in the irradiation region of the electromagnetic waves may be exhibited. Accordingly, the range of the electromagnetic wave-absorbing inorganic additives applicable for forming excellent conductive patterns in the irradiation region of the electromagnetic waves may be further extended.

On the other hand, in the composition for forming a conductive pattern according to the one embodiment described above, the electromagnetic wave-absorbing inorganic additive may be contained in an amount of about 0.05 to 30% by weight or about 0.1 to 20% by weight based on the total composition. Due to the range of content, the degradation of the physical properties of the polycarbonate-based resin substrate caused by the addition of the above-mentioned inorganic additives may be reduced, and at the same time, the characteristic of about $1.6 < -\log(Ls) < 6.0$ may be easily achieved by using the specific inorganic additives in the content specified above.

In addition, in the case in which additional electromagnetic wave-absorbing auxiliaries are used, as needed, together with the electromagnetic wave-absorbing inorganic additives, the electromagnetic wave-absorbing auxiliary may be contained in an amount of about 0.01 to 20% by weight based on the total composition. Herein, the carbon-based black pigment such as carbon black, etc. may be contained in an amount of about 0.01 to 5% by weight or about 0.1 to 2% by weight, and titanium dioxide may be contained in the amount of about 0.1 to 20% by weight or about 0.5 to 10% by weight.

Further, the electromagnetic wave-absorbing inorganic additive may have a particle shape of a large sphere, and may be contained in the form of having an average particle diameter of about 0.05 to 20 μm or about 0.1 to 15 μm. Furthermore, in Equation 1 above, it may become one factor which easily facilitates the achievement of the characteristic of about $1.6 < -\log(Ls) < 6.0$ by appropriately adjusting the effective radius Re. The electromagnetic wave-absorbing inorganic additive having the average particle size and particle shape above may have an effective radius Re, for example, of about 0.1 to 1500, although it may be different depending on the type and density of the materials constituting them.

Moreover, the composition for forming a conductive pattern may be a composition that is applied to form a conductive pattern by irradiating a laser electromagnetic wave having a wavelength of about 1000 nm to 1200 nm, typically about 1064 nm, with an average power of about 1 to 20 W or about 1.5 to 20 W, and carrying out the plating in the irradiated region of the laser electromagnetic wave. Such an irradiation condition of the electromagnetic waves is a mild irradiation condition which is commercially and generally applied, and when it is applied to the composition according to one embodiment, an excellent electromagnetic wave sensitivity may be achieved, the surface roughness of a certain level or higher and metal nucleus are sufficiently formed on the polymer resin substrate, thereby easily forming excellent conductive patterns exhibiting excellent adhesion to the surface of polymer resin substrates even under such irradiation condition, in the irradiation region of the electromagnetic waves. Therefore, the degradation of the physical properties of the polymer resin substrate caused by the irradiation of the electromagnetic waves under the harsh condition may be minimized.

Meanwhile, the composition for forming a conductive pattern according to the one embodiment described above may further include at least one additive selected from the group consisting of UV stabilizer, flame retardant, lubricant, antioxidant, inorganic filler, color additive, impact modifier, flow modifier and functional modifier in an amount of about 0.01 to 30% by weight based on the total composition. For example, the inorganic filler such as glass fiber may be contained in an amount of about 0.5 to 30% by weight based on the total composition, and the additives such as impact modifier, a flame retardant, and flow modifier may be contained in an amount of 0.01 to 5% by weight.

On the other hand, according to another embodiment of the present invention, there is provided a method for forming a conductive pattern by direct irradiation of electromagnetic waves using the composition for forming a conductive pattern of the one embodiment described above. The method for forming a conductive pattern may include forming a resin layer by molding the composition for forming a conductive pattern of the one embodiment described above into a resin product or by applying the composition onto another product; irradiating an electromagnetic wave having a wavelength in the infrared region onto a predetermined region of the resin product or resin layer; and forming a conductive metal layer by plating the irradiation region of the electromagnetic wave.

Hereinafter, with reference to the accompanying drawings, the method for forming a conductive pattern according to another embodiment above will be described for each step. For reference, FIG. 1 shows an example of the method for forming a conductive pattern in a simplified manner for each process step.

In the method for forming a conductive pattern, first, a resin layer may be formed by molding the composition for forming a conductive pattern described above into a resin product or by applying the composition onto another product. In molding the resin product or forming the resin layer, a method for molding a product or a method for forming a resin layer using a conventional polymer resin composition may be applied without any specific limitation. For example, in molding the resin product using the composition above, the composition for forming a conductive pattern is formed into pellets or particles after it has been extruded and cooled, and then is subjected to injection molding into a desired shape to produce various polymer resin products.

The thus-formed polymer resin product or resin layer may be in the form in which the electromagnetic wave-absorbing inorganic additives described above are uniformly dispersed on the resin substrate formed from the polymer resin. In particular, the electromagnetic wave-absorbing inorganic additives described above may be uniformly dispersed throughout the entire region of the resin substrate, and thus be maintained as having a non-conductive state.

After forming the polymer resin product or resin layer, as shown in the first drawing of FIG. 1, an electromagnetic wave such as a laser having a wavelength in the infrared region, etc. may be irradiated to a predetermined region of the resin product or resin layer on which conductive patterns are to be formed. When the electromagnetic wave is irradiated, a surface roughness of a certain level or higher may be formed on the surface of the polymer resin substrate in the irradiated region, and the conductive metal elements or ions thereof are reduced/precipitated from the electromagnetic wave-absorbing inorganic additives, etc., and thereby generating a metal nucleus containing the same (See, second drawing of FIG. 1).

In particular, as the metal nuclei and surface roughness are formed only in a predetermined region irradiated with the electromagnetic waves, when the plating step described later is performed, in the region irradiated with electromagnetic wave, that is, the region which the metal nuclei are generated and which has a surface roughness of a certain level or higher, the uniform plating with the metal nuclei serving as a seed is favorably performed, and the conductive metal layer formed by plating is adhered to the surface of the polymer resin substrate with a relatively high adhesive force, thereby forming conductive patterns. On the contrary, as for the remaining part, the plating itself may not be proceeded properly as the metal nuclei are not formed (that is, the conductive metal layer itself may not be properly formed), and even if plating is partially carried out, the conductive metal layer cannot exhibit adhesion to the surface of the polymer resin substrate. Therefore, in the non-irradiated region of the electromagnetic waves, the conductive metal layer itself cannot be formed, or even if the plating is partially carried out, the conductive metal layer formed by such plating may be easily removed. Accordingly, the conductive metal layer may selectively remain only in the irradiation region of the electromagnetic waves, and thus, micro-conductive patterns in the desired form may be favorably formed on the polymer resin substrate.

Meanwhile, in the step of irradiating the electromagnetic waves, a laser electromagnetic wave having a wavelength corresponding to the infrared region, for example, a wavelength of about 1000 nm to 1200 nm or about 1060 nm to 1070 nm or about 1064 nm may be irradiated with an average power of about 1 to 20 W.

On the other hand, after carrying out the step of irradiating the electromagnetic waves described above, as shown in the third drawing of FIG. 1, the step of forming a conductive metal layer by plating the irradiation region of the electromagnetic waves may be carried out. As a result of carrying out the plating step, the conductive metal layer exhibiting excellent adhesion to the polymer resin substrate may be formed in the irradiation region of the electromagnetic waves, and in the remaining region, the conductive metal layer may be easily removed. Accordingly, micro-conductive patterns may be selectively formed in the predetermined region on the polymer resin substrate.

In the plating step, the polymer resin substrate may be treated with an electroless plating solution containing a reducing agent and conductive metal ion. With the progress of the plating step, the conductive metal ion contained in the electroless plating solution may be chemically reduced to form a conductive pattern. In particular, such a conductive pattern may be favorably formed by the excellent adhesive force in the irradiation region of the electromagnetic waves. Further, in the case in which the metal nuclei are formed in the irradiation region of the electromagnetic waves, the conductive pattern may be more favorably formed by using the metal nuclei as a seed.

On the other hand, according to still another embodiment of the present invention, there is provided a resin structure having a conductive pattern by the composition for forming a conductive pattern and the method for forming a conductive pattern described above. The resin structure may include a polymer resin substrate containing a polycarbonate resin; an electromagnetic wave-absorbing inorganic additive which is dispersed in the polymer resin substrate, and which absorbs an electromagnetic wave having a wavelength in the infrared region and satisfies the characteristic that a laser sensitivity Ls defined by Equation 1 below is $1.6 < -\log(Ls) < 6.0$; and a conductive metal layer formed on a predetermined region of the polymer resin substrate.

In the resin structure, the predetermined region on which the conductive metal layer is formed may correspond to the region irradiated with the electromagnetic waves having a wavelength of the infrared region in the polymer resin substrate.

The resin structure described above may be applied to various resin products or resin layers such as cell phone cases having a conductive pattern for antenna, or various resin products or resin layers having conductive patters of other RFID tags, various sensors or MEMS structures, etc.

Hereinafter, the features and advantages of the present invention will be described in more detail by way of specific examples of the invention. However, these examples are given for illustrative purposes only, and the protection scope of the present invention is not intended to be limited by these examples.

Example 1: Formation of Conductive Patterns by Direct Laser Irradiation

A spherical non-conductive metal compound powder of $CuCrO_2$ was used together with a polycarbonate resin. Further, a composition for forming a conductive pattern by irradiation of electromagnetic waves was prepared by using thermal stabilizers (IR1076, PEP36), a UV stabilizer (UV329), a lubricant (EP184), and an impact modifier (S2001) which are additives for the process and stabilization.

5% by weight of the non-conductive metal compound, 4% by weight of the impact modifier and 1% by weight of other additives including the lubricant relative to the polycarbonate resin were mixed, and blended through extrusion at 260 to 280° C. to prepare a resin composition in the form of pellets. The resin composition in the form of extruded pellets was subject to injection molding into a substrate having a diameter of 100 mm and a thickness of 2 mm at about 260 to 280° C.

Meanwhile, as for the resin substrate prepared above, a laser having a wavelength of 1064 nm was irradiated to an area of 15 mm×15 mm, by using a Nd-YAG laser apparatus, under Laser condition 1 below to activate the surface.

| Laser Condition 1 |
| --- |
| Wavelength: 1064 nm |
| Frequency: 40 kHz |
| Scan speed: 2 m/s |
| Interval between patterns: 35 μm |
| Beam diameter: 15 to 20 μm |
| Pulse interval: 220 ns |

Subsequently, an electroless plating process was carried out for the resin substrate whose surface had been activated by the laser irradiation as follows. A plating solution was prepared by dissolving 3 g of copper sulfate, 14 g of Rochelle salt and 4 g of sodium hydroxide in 100 ml of deionized water. 40 ml of the prepared plating solution was added with 1.6 ml of formaldehyde as a reducing agent. The resin substrate whose surface had been activated with a laser was immersed in the plating solution for 3 to 5 hours, and then washed with distilled water. Through these processes, conductive patterns having a thickness of 10 μm or higher were formed. The adhesion performance of the formed conductive patterns (or plated layer) was evaluated according to the ISO 2409 standard method. In the evaluation, a 3M scotch #371 tape having an adhesive force of 4.9 N/10 mm width was used, and the conductive patterns was subjected to a cross cut test of 10×10 grid. The evaluation was performed according to the delaminated area of the conductive patterns under the following ISO class standard:

1. Class 0: When the delaminated area of the conductive pattern is 0% of the area of the conductive pattern of the evaluation target;
2. Class 1: When the delaminated area of the conductive pattern is more than 0% to less than or equal to 5% of the area of the conductive pattern of the evaluation target;
3. Class 2: When the delaminated area of the conductive pattern is more than 5% to less than or equal to 15% of the area of the conductive pattern of the evaluation target;
4. Class 3: When the delaminated area of the conductive pattern is more than 15% to less than or equal to 35% of the area of the conductive pattern of the evaluation target;
5. Class 4: When the delaminated area of the conductive pattern is more than 35% to less than or equal to 65% of the area of the conductive pattern of the evaluation target;
6. Class 5: When the delaminated area of the conductive pattern is more than 65% of the area of the conductive pattern of the evaluation target.

As a result of the evaluation, when the conductive pattern was rated as class 0 or 1 and the delaminated area of the conductive pattern was 5% or less of the area of the conductive pattern of the evaluation target, it was evaluated that conductive patterns having excellent adhesion were favorably formed.

In Example 1 above, the formation of the conductive patterns and the adhesion evaluation thereof were repeated by increasing the average power for irradiating the laser within the range of 1 to 30 W. As a result, the minimum power condition of the laser required for forming an excellent conductive pattern was derived, and the results are shown in Table 1 below.

On the other hand, the spherical non-conductive metal compound powder of $CuCrO_2$ was subject to pretreatment (pretreatment for measuring specific surface area) at a temperature of about 150° C. for about 3 hours, and then the specific surface area A (m$^2$/g) was measured by BET method, meanwhile, it was confirmed that the density B (g/cm$^3$) of the material was 5.627 g/cm$^3$. From the measurement results, the effective radius Re was calculated from the equation of Re=300/[A (m$^2$/g)×B (g/cm$^3$)], and the calculation results of the A (m$^2$/g) and Re are shown together in FIG. 1 below.

In addition, the absorbance IR (%) of the spherical non-conductive metal compound powder of $CuCrO_2$ relative to the laser having the wavelength of 1064 nm was measured using a UV-vis-NIR spectrometer, and from the measurement results, the value of Iaa was measured by the equation of Iaa=$(1-I_R)^2/2\ I_R$. The values of Ls and −log (Ls) were calculated by substituting the Iaa, wt (content (wt %) of non-conductive metal compound/100) and Re into the equation 1 above. The values of Iaa, wt, Re, and −log (Ls) are shown together in Table 1.

Examples 2 to 17: Formation of Conductive Pattern by Direct Laser Irradiation

The conductive patterns were formed in the same manner as described in Example 1, except that the types of non-conductive metal compounds, BET specific surface area (particle size modified) and content (wt %) thereof were modified as summarized in Table 1 below. The physical properties (Iaa, wt, Re and −log (Ls), and the minimum power condition of the laser electromagnetic wave required for forming an excellent conductive pattern) of the non-conductive metal compounds and conductive patterns are summarized together in Table 1 below.

TABLE 1

| | Non-conductive metal compound | BET specific surface area | Re | wt | Iaa | −log(Ls) | Minimum power condition (W) |
|---|---|---|---|---|---|---|---|
| Example 1 | $CuCrO_2$ | 1.79 | 29.93 | 0.05 | 2.71 | 2.94 | 8.6 |
| Example 2 | $CuCrO_2$ | 4.12 | 13.00 | 0.05 | 1.64 | 2.65 | 7.9 |
| Example 3 | $CuCrO_2$ | 6.70 | 8.00 | 0.05 | 1.19 | 2.49 | 6.4 |
| Example 4 | $CuCrO_2$ | 6.70 | 8.00 | 0.03 | 1.19 | 2.71 | 7.9 |
| Example 5 | $CuCrO_2$ | 6.70 | 8.00 | 0.02 | 1.19 | 2.89 | 7.9 |
| Example 6 | $CuCrO_2$ | 6.70 | 8.00 | 0.01 | 1.19 | 3.19 | 9.6 |
| Example 7 | $CuAlO_2$ | 3.57 | 20.50 | 0.05 | 0.53 | 3.41 | 10 |
| Example 8 | $CuAlO_2$ | 3.57 | 20.50 | 0.03 | 0.53 | 3.63 | 10 |
| Example 9 | $CuAlO_2$ | 3.57 | 20.50 | 0.02 | 0.53 | 3.81 | 11.4 |
| Example 10 | $CuAlO_2$ | 3.57 | 20.50 | 0.01 | 0.53 | 4.11 | 12.9 |
| Example 11 | $CuSO_4$ | 0.6 | 138.89 | 0.05 | 0.44 | 4.66 | 17.1 |
| Example 12 | $CuSO_4$ | 0.6 | 138.89 | 0.03 | 0.44 | 4.88 | 18 |
| Example 13 | CuI | 5.3 | 9.98 | 0.07 | 0.07 | 3.95 | 12.9 |
| Example 14 | CuI | 5.3 | 9.98 | 0.05 | 0.07 | 3.85 | 14.3 |
| Example 15 | CuI | 5.3 | 9.98 | 0.04 | 0.07 | 3.71 | 11.4 |
| Example 16 | $CuSn_2(PO_4)_3$ | 3.16 | 20.46 | 0.05 | 0.07 | 4.44 | 15.7 |
| Example 17 | $CuSn_2(PO_4)_3$ | 1.72 | 37.59 | 0.05 | 0.05 | 4.80 | 17.4 |

In Table 1 above, the relationship between the −log (Ls) value (X axis) and the minimum power condition of the laser electromagnetic wave required for forming an excellent conductive pattern (Y axis) is summarized with a graph, and is shown in FIG. 2.

For reference, in FIG. 2, LGD additive 1 is $CuCrO_2$; LGD additive 2 is $CuAlO_2$; LGD additive 3 is $CuSO_4$; LGD additive 4 is CuI; and LGD additive 5 is $CuSn_2(PO_4)_3$.

With reference to Table 1 and FIG. 2, in the case in which the non-conductive metal compounds satisfying the relationship of about 1.6<−log (Ls)<6.0, more particularly about 1.6<−log (Ls)<5.6 were used as the electromagnetic wave-absorbing inorganic additives, it was confirmed that even when the irradiation condition of the laser electromagnetic wave was a mild condition with an average power of about 1 to 20 W, excellent conductive patterns having excellent adhesive force could be formed. Further, it was confirmed that the −log (Ls) and the minimum power condition of the laser electromagnetic wave required for forming an excellent conductive pattern are substantially in a proportional relationship.

Examples 18 to 34: Formation of Conductive Pattern by Direct Laser Irradiation

The conductive patterns were formed by the same composition and method as in Examples 1 to 17, except that the laser irradiation condition was modified as shown in Laser condition 2 below.

| Laser Condition 2 |
| --- |
| Wavelength: 1064 nm |
| Frequency: 50 kHz |
| Scan speed: 2 m/s |
| Interval between patterns: 50 μm |
| Beam diameter: 30 to 35 μm |
| Pulse interval: 55 ns |

The physical properties (Iaa, wt, Re and −log (Ls), and the minimum power condition of the laser electromagnetic wave required for forming an excellent conductive pattern) of the non-conductive metal compounds and conductive patterns are summarized together in Table 2 below.

In Table 2 above, the relationship between the −log (Ls) value (X axis) and the minimum power condition of the laser electromagnetic wave required for forming an excellent conductive pattern (Y axis) is summarized with a graph, and is shown in FIG. 3.

For reference, in FIG. 3, LGD additive 1 is $CuCrO_2$; LGD additive 2 is $CuAlO_2$; LGD additive 3 is $CuSO_4$; LGD additive 4 is $CuI$; and LGD additive 5 is $CuSn_2(PO_4)_3$.

With reference to Table 2 above and FIG. 3, in the case in which the laser irradiation condition was partially modified as in Examples 18 to 34, and the non-conductive metal compounds satisfying the relationship of about 1.6<−log (Ls)<6.0, more particularly about 1.6<−log (Ls)<5.6 were used as the electromagnetic wave-absorbing inorganic additives, it was confirmed that even when the irradiation condition of the laser electromagnetic wave was a mild condition with an average power of about 2.2 to 14 W, excellent conductive patterns having excellent adhesive force could be formed. In particular, due to a high peak power at the time of the laser irradiation, it was confirmed that excellent conductive patterns could be formed under the power conditions much lower than those in Examples 1 to 17.

Examples 35 to 51: Formation of Conductive Patterns by Direct Laser Irradiation

The conductive patterns were formed by the same composition and method as in Examples 1 to 17, except that 1% by weight of carbon black was added to Examples 1 to 17, and that the content of the polycarbonate resin was reduced accordingly.

The physical properties (Iaa, wt, Re and −log (Ls), and the minimum power condition of the laser electromagnetic wave required for forming an excellent conductive pattern) of the non-conductive metal compounds and conductive patterns are summarized together in Table 3 below.

TABLE 2

| | Non-conductive metal compound | BET specific surface area | Re | wt | Iaa | −log(Ls) | Minimum power condition (W) |
| --- | --- | --- | --- | --- | --- | --- | --- |
| Example 18 | $CuCrO_2$ | 1.79 | 29.93 | 0.05 | 2.71 | 2.94 | 6 |
| Example 19 | $CuCrO_2$ | 4.12 | 13.00 | 0.05 | 1.64 | 2.65 | 5.5 |
| Example 20 | $CuCrO_2$ | 6.70 | 8.00 | 0.05 | 1.19 | 2.49 | 4.5 |
| Example 21 | $CuCrO_2$ | 6.70 | 8.00 | 0.03 | 1.19 | 2.71 | 5.5 |
| Example 22 | $CuCrO_2$ | 6.70 | 8.00 | 0.02 | 1.19 | 2.89 | 5.5 |
| Example 23 | $CuCrO_2$ | 6.70 | 8.00 | 0.01 | 1.19 | 3.19 | 6.5 |
| Example 24 | $CuAlO_2$ | 3.57 | 20.50 | 0.05 | 0.53 | 3.41 | 7 |
| Example 25 | $CuAlO_2$ | 3.57 | 20.50 | 0.03 | 0.53 | 3.63 | 7 |
| Example 26 | $CuAlO_2$ | 3.57 | 20.50 | 0.02 | 0.53 | 3.81 | 8 |
| Example 27 | $CuAlO_2$ | 3.57 | 20.50 | 0.01 | 0.53 | 4.11 | 9 |
| Example 28 | $CuSO_4$ | 0.6 | 138.89 | 0.05 | 0.44 | 4.66 | 12 |
| Example 29 | $CuSO_4$ | 0.6 | 138.89 | 0.03 | 0.44 | 4.88 | 12.5 |
| Example 30 | $CuI$ | 5.3 | 9.98 | 0.07 | 0.07 | 3.95 | 8 |
| Example 31 | $CuI$ | 5.3 | 9.98 | 0.05 | 0.07 | 3.85 | 9 |
| Example 32 | $CuI$ | 5.3 | 9.98 | 0.04 | 0.07 | 3.71 | 10 |
| Example 33 | $CuSn_2(PO_4)_3$ | 3.16 | 20.46 | 0.05 | 0.07 | 4.44 | 11 |
| Example 34 | $CuSn_2(PO_4)_3$ | 1.72 | 37.59 | 0.05 | 0.05 | 4.80 | 12 |

TABLE 3

|  | Non-conductive metal compound (+carbon black) | BET specific surface area | Re | wt | Iaa | −log(Ls) | Minimum power condition (W) |
|---|---|---|---|---|---|---|---|
| Example 35 | $CuCrO_2$ | 1.79 | 29.93 | 0.05 | 2.71 | 2.94 | 8 |
| Example 36 | $CuCrO_2$ | 4.12 | 13.00 | 0.05 | 1.64 | 2.65 | 7 |
| Example 37 | $CuCrO_2$ | 6.70 | 8.00 | 0.05 | 1.19 | 2.49 | 6 |
| Example 38 | $CuCrO_2$ | 6.70 | 8.00 | 0.03 | 1.19 | 2.71 | 7.5 |
| Example 39 | $CuCrO_2$ | 6.70 | 8.00 | 0.02 | 1.19 | 2.89 | 7.5 |
| Example 40 | $CuCrO_2$ | 6.70 | 8.00 | 0.01 | 1.19 | 3.19 | 8 |
| Example 41 | $CuAlO_2$ | 3.57 | 20.50 | 0.05 | 0.53 | 3.41 | 8.5 |
| Example 42 | $CuAlO_2$ | 3.57 | 20.50 | 0.03 | 0.53 | 3.63 | 8.5 |
| Example 43 | $CuAlO_2$ | 3.57 | 20.50 | 0.02 | 0.53 | 3.81 | 9.2 |
| Example 44 | $CuAlO_2$ | 3.57 | 20.50 | 0.01 | 0.53 | 4.11 | 9.6 |
| Example 45 | $CuSO_4$ | 0.6 | 138.89 | 0.05 | 0.44 | 4.66 | 13 |
| Example 46 | $CuSO_4$ | 0.6 | 138.89 | 0.03 | 0.44 | 4.88 | 13 |
| Example 47 | CuI | 5.3 | 9.98 | 0.07 | 0.07 | 3.95 | 9 |
| Example 48 | CuI | 5.3 | 9.98 | 0.05 | 0.07 | 3.85 | 9.5 |
| Example 49 | CuI | 5.3 | 9.98 | 0.04 | 0.07 | 3.71 | 9 |
| Example 50 | $CuSn_2(PO_4)_3$ | 3.16 | 20.46 | 0.05 | 0.07 | 4.44 | 12 |
| Example 51 | $CuSn_2(PO_4)_3$ | 1.72 | 37.59 | 0.05 | 0.05 | 4.80 | 15 |

In Table 3 above, the relationship between the −log (Ls) value (X axis) and the minimum power condition of the laser electromagnetic wave required for forming an excellent conductive pattern (Y axis) is summarized with a graph, and is shown in FIG. 4. Herein, it is shown in comparison with the graph related to Examples 1 to 17.

With reference to Table 3 and FIG. 4, in Examples 35 to 51, it was confirmed that excellent conductive patterns could be formed under the power conditions much lower than those in Examples 1 to 17, as the carbon black which is an electromagnetic wave-absorbing auxiliary was further used.

Therefore, due to the addition of the carbon black, it is expected that excellent conductive patterns having excellent adhesive force can be formed, even when the electromagnetic wave-absorbing inorganic additive exhibiting the characteristic of about 5.6≤−log(Ls)<6.0, which is relatively high even in the range of about 1.6<−log (Ls)<6.0, is used.

Example 52: Formation of Conductive Patterns by Direct Laser Irradiation

The conductive patterns were formed by the same composition and method as in Example 17, except that 5% by weight of titanium dioxide was added to Example 17, and that the content of the polycarbonate resin was reduced accordingly.

Various physical properties (Iaa, wt, Re and −log (Ls)) of the non-conductive metal compounds in Example 52 were the same as those in Example 17, and the minimum power condition of the laser electromagnetic wave required for forming an excellent conductive pattern was determined by repeating the test in accordance with the same method as in Example 17, particularly, the method shown in FIG. 5. As a result, it was confirmed that excellent conductive patterns could be formed under the minimum power of 14.3 W (in the case of Example 17, excellent conductive patterns were not obtained until the power of 14.3 W, and the minimum power was determined to be 17.4 W).

Therefore, even with the addition of such titanium oxide, it is expected that excellent conductive patterns having excellent adhesive force can be formed even when the electromagnetic wave-absorbing inorganic additive exhibiting the characteristic of about 5.6≤−log(Ls)<6.0, which is relatively high in the range of about 1.6<−log (Ls)<6.0, is used. This is because the titanium dioxide seems to be able to further increase the value of Ls (further reduction of −log (Ls)) by maximizing the scattering effect and scattering rate of the laser.

The invention claimed is:

1. A composition for forming a conductive pattern by irradiation of electromagnetic waves comprising: a polymer resin including a polycarbonate resin; and an electromagnetic wave-absorbing inorganic additive which absorbs an electromagnetic wave in the infrared region, and satisfies the characteristic that a laser sensitivity LS defined by Equation 1 below is 1.6<−log(Ls)<6.0:

$$\text{Laser sensitivity } Ls = Re^{-1.4} \times wt \times Iaa \qquad \text{[Equation 1]}$$

In Equation 1 above,

Re represents an effective radius of the electromagnetic wave-absorbing inorganic additive obtained by the equation of $Re=300/[A(m^2/g) \times B(g/cm^3)]$, from the BET specific surface area $A(m^2/g)$ and density $B(g/cm^3)$ of the electromagnetic wave-absorbing inorganic additive, wt is a value representing the content (weight) of the electromagnetic wave-absorbing inorganic additive in terms of a weight fraction relative to the total composition when the total content (weight) of the composition for forming a conductive pattern is 1, and Iaa represents an effective light absorption rate of the electromagnetic wave-absorbing inorganic additive obtained by the equation of $Iaa=(1-I_R)^2/(2I_R)$ (%), $I_R$ represents an absorbance (%) for electromagnetic waves having a wavelength in a predetermined infrared region having a wavelength of about 1,000 nm to 1,200 nm measured using a UV-vis-IR spectrum, relative to the electromagnetic wave-absorbing inorganic additive.

2. The composition for forming a conductive pattern by irradiation of electromagnetic waves of claim 1, wherein the polymer resin further comprises at least one resin selected from the group consisting of acrylonitrile butadiene styrene resin, polyalkylene terephthalate resin, polypropylene resin and polyphthalamide resin.

3. The composition for forming a conductive pattern by irradiation of electromagnetic waves of claim 1, wherein the electromagnetic wave-absorbing inorganic additive contains at least one conductive metal element and comprises a non-conductive metal compound, which contains cations and anions and in which the cations and anions are chemically bonded to each other.

4. The composition for forming a conductive pattern by irradiation of electromagnetic waves of claim 1, wherein the electromagnetic wave-absorbing inorganic additive comprises at least one non-conductive metal compound selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, $CuAlO_2$, $CuGaO_2$, $CuInO_2$, $CuTlO_2$, $CuYO_2$, $CuScO_2$, $CuLaO_2$, $CuLuO_2$, $NiAlO_2$, $NiGaO_2$, $NiInO_2$, $NiTlO_2$, $NiYO_2$, $NiScO_2$, $NiLaO_2$, $NiLuO_2$, $AgAlO_2$, $AgGaO_2$, $AgInO_2$, $AgTlO_2$, $AgYO_2$, $AgScO_2$, $AgLaO_2$, $AgLuO_2$, $CuSn_2(PO_4)_3$, $CuI$, $CuCl$, $CuBr$, $CuF$, $AgI$, $CuSO_4$, $Cu_2P_2O_7$, $Cu_3P_2O_8$, $Cu_4P_2O_9$, $Cu_5P_2O_{10}$ and $Cu_2P_4O_{12}$.

5. The composition for forming a conductive pattern by irradiation of electromagnetic waves of claim 3, wherein the electromagnetic wave-absorbing inorganic additive satisfies the characteristic that the laser sensitivity Ls is $1.6<-\log(Ls)<5.6$, and absorbs electromagnetic waves having a wavelength in the infrared region to generate a metal nucleus containing the at least one conductive metal element or ions thereof.

6. The composition for forming a conductive pattern by irradiation of electromagnetic waves of claim 1, wherein the electromagnetic wave-absorbing inorganic additive satisfies the characteristic that the laser sensitivity Ls is $1.6<-\log(Ls)<5.6$, and
further comprises a conductive seed-forming agent which generates a metal nucleus containing conductive metal elements or ions thereof by irradiation of electromagnetic waves having a wavelength in the infrared region.

7. The composition for forming a conductive pattern by irradiation of electromagnetic waves of claim 6, wherein the conductive seed-forming agent is applied and formed on the surface of the polymer resin.

8. The composition for forming a conductive pattern by irradiation of electromagnetic waves of claim 6, wherein the electromagnetic wave-absorbing inorganic additive comprises at least one selected from the group consisting of $Fe_3(PO_4)_2$, $Zn_3(PO_4)_2$, $ZnFe_2(PO_4)_2$, niobium oxide and molybdenum oxide and the conductive seed-forming agent comprises at least one conductive metal selected from the group consisting of copper (Cu), platinum (Pt), palladium (Pd), silver (Ag), gold (Au), nickel (Ni), tungsten (W), titanium (Ti), chromium (Cr), aluminum (Al), zinc (Zn), tin (Sn), lead (Pb), magnesium (Mg), manganese (Mn) and iron (Fe), its ion or complex ion.

9. The composition for forming a conductive pattern by irradiation of electromagnetic waves of claim 1, further comprising at least one electromagnetic wave-absorbing auxiliary selected from the group consisting of carbon black, burnt pine, oily smoke, lamp black, channel black, furnace black, acetylene black and titanium dioxide ($TiO_2$).

10. The composition for forming a conductive pattern by irradiation of electromagnetic waves of claim 9, wherein the electromagnetic wave-absorbing auxiliary is contained in an amount of 0.01 to 20% by weight based on the total composition.

11. The composition for forming a conductive pattern by irradiation of electromagnetic waves of claim 1, wherein the electromagnetic wave-absorbing inorganic additive is contained in an amount of 0.05 to 30% by weight based on the total composition.

12. The composition for forming a conductive pattern by irradiation of electromagnetic waves of claim 1, wherein a laser electromagnetic wave having a wavelength of 1000 nm to 1200 nm is irradiated with an average power of 1 to 20 W, and plating is carried out in the irradiation region of the laser electromagnetic wave to form a conductive pattern.

13. The composition for forming a conductive pattern by irradiation of electromagnetic waves of claim 1, wherein the electromagnetic wave-absorbing inorganic additive has an average particle diameter of 0.05 μm to 20 μm.

14. The composition for forming a conductive pattern by irradiation of electromagnetic waves of claim 1, further comprising at least one additive selected from the group consisting of UV stabilizer, flame retardant, lubricant, antioxidant, inorganic filler, color additive, impact modifier, flow modifier and functional modifier in an amount of 0.01 to 30% by weight based on the total composition.

* * * * *